United States Patent
Li et al.

(10) Patent No.: US 7,551,447 B2
(45) Date of Patent: Jun. 23, 2009

(54) RESILIENT FASTENER AND HEAT DISSIPATION APPARATUS INCORPORATING THE SAME

(75) Inventors: Yuan-Wu Li, Shenzhen (CN); Ming Yang, Shenzhen (CN); Cheng-Peng Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/769,665

(22) Filed: Jun. 27, 2007

(65) Prior Publication Data

US 2008/0298013 A1    Dec. 4, 2008

(30) Foreign Application Priority Data

Jun. 1, 2007    (CN) .................... 2007 1 0074804

(51) Int. Cl.
*H05K 7/20* (2006.01)
*H01L 23/36* (2006.01)

(52) U.S. Cl. .................. 361/719; 361/688; 361/704; 165/80.3; 165/104.33; 174/16.3; 174/252

(58) Field of Classification Search ......... 361/171–722, 361/732, 756; 257/706–727; 174/15.1, 15.2, 174/16.3, 252, 254, 260; 165/80.2, 80.3, 165/80.4, 80.5, 104.33, 121–125, 185; 411/352, 411/353, 152, 153, 154, 544; 24/500, 502, 24/544, 615, 625; 248/316.7, 505, 510
See application file for complete search history.

(56) References Cited

U.S. PATENT DOCUMENTS

| 5,828,550 | A | * | 10/1998 | Horng | ............... 361/697 |
| 6,450,248 | B1 | * | 9/2002 | Chang | ............... 165/80.3 |
| 6,731,504 | B1 | * | 5/2004 | Liu | ............... 361/704 |
| 7,042,728 | B2 | * | 5/2006 | Hu | ............... 361/704 |
| 7,046,516 | B2 | | 5/2006 | Lee et al. | |
| 7,283,367 | B2 | * | 10/2007 | Yu et al. | ............... 361/719 |
| 7,327,575 | B2 | * | 2/2008 | Yu et al. | ............... 361/719 |
| 2008/0106869 | A1 | * | 5/2008 | Li | ............... 361/704 |

* cited by examiner

*Primary Examiner*—Michael V Datskovskiy
(74) *Attorney, Agent, or Firm*—Frank R. Niranjan

(57) ABSTRACT

A heat dissipation apparatus includes a retention module (10), a heat sink (20) disposed on the retention module, a fastening cover (23) covering the heat sink, and a plurality of fasteners (30) connected with the retention module and the fastening cover for mounting the heat sink onto a heat generating electronic component (50). The fastener includes a fastening member (31) and an operating member (32). The fastening member has a first end (313) engaged with the retention module and a second end (311) opposed to the first end. The operating member includes a resilient pressing portion (321) pivotably connected with the second end of the fastening member and contacting with the fastening cover, and an operation portion (322) connected with the pressing portion.

15 Claims, 5 Drawing Sheets

RESILIENT FASTENER AND HEAT DISSIPATION APPARATUS INCORPORATING THE SAME

BACKGROUND OF THE INVENTION

1. Field of the Invention

The present invention relates to fasteners, and more particularly to a fastener which can mount a heat sink onto a heat generating electronic component and maintain an intimate contact between the heat sink and the heat generating electronic component.

2. Description of Related Art

Heat dissipation apparatuses are traditionally used in micro-electronics to help transfer heat from heat generating electronic components mounted on a printed circuit board.

Referring to U.S. Pat. No. 7,046,516, a related heat dissipation apparatus for a heat generating electronic component mounted on a printed circuit board is shown. The heat dissipation apparatus includes a retention module attached to the printed circuit board, a heat sink disposed on the retention module and having an intimate contact with the heat generating electronic component, and two clips for mounting the heat sink onto the heat generating electronic component.

The heat sink has two opposite platforms extending outwardly from two sides thereof. The two platforms define a pair of parallel slots extending toward each other from two opposite edges thereof. The clip includes a retaining member and an operating member pivotably connected with the retaining member. Each of the retaining members has three openings at a bottom thereof, whilst the retention module has six protrusions corresponding to the openings of the retaining members. The operating member has a cam-shaped pressing portion connected with the retaining member and an elongate holding portion extending from the pressing portion.

In assembly of the heat dissipation apparatus, the retaining members of the clips are received in the slots of the heat sink with the operating members of the clips contacting with top surfaces of the platforms. The heat sink and the clips are placed on the retention module with the protrusions of the retention module being received in the openings of the retaining members of the clips. The holding portions of the operating members are driven to rotate with respect to the platforms of the heat sink from an unlocked position to a locked position. During the rotation of the operating members, the retaining members are driven by the holding portions to move upwardly so that the heat sink has intimate contact with the heat generating electronic component. Thus, the heat sink is mounted on the heat generating electronic component and tightly engaged therewith. Accordingly, heat generated by the electronic component can be effectively absorbed by the heat sink.

In the heat dissipation apparatus, there is no resilient structure, which can provide resilient force as being depressed, disposed between the retention module and the heat sink. Therefore, the connection between the heat sink and the heat generating electronic component will become loose after undergoing a continuous forces, such as, for example, oscillating forces generated by operation of a heat dissipating fan. Therefore, it is necessary to provide a clip which can maintain intimate contact between the heat sink and the heat generating electronic component even after a long period of use of the heat sink.

SUMMARY OF THE INVENTION

The present invention relates to a resilient fastener and a heat dissipation apparatus incorporating the same. The heat dissipation apparatus includes a retention module, a heat sink disposed on the retention module, a fastening cover covering the heat sink, and a plurality of fasteners connected with the retention module and the fastening cover for mounting the heat sink onto a heat generating electronic component. The fastener includes a fastening member and an operating member. The fastening member has a first end engaged with the retention module and a second end opposite to the first end. The operating member includes a resilient pressing portion pivotably connected with the second end of the fastening member and contacting with the fastening cover, and an operation portion connected with the pressing portion.

Other advantages and novel features of the present invention will become more apparent from the follow detailed description of preferred embodiments when taken in conjunction with the accompanying drawings, in which:

DETAILED DESCRIPTION OF THE INVENTION

Figure 1:
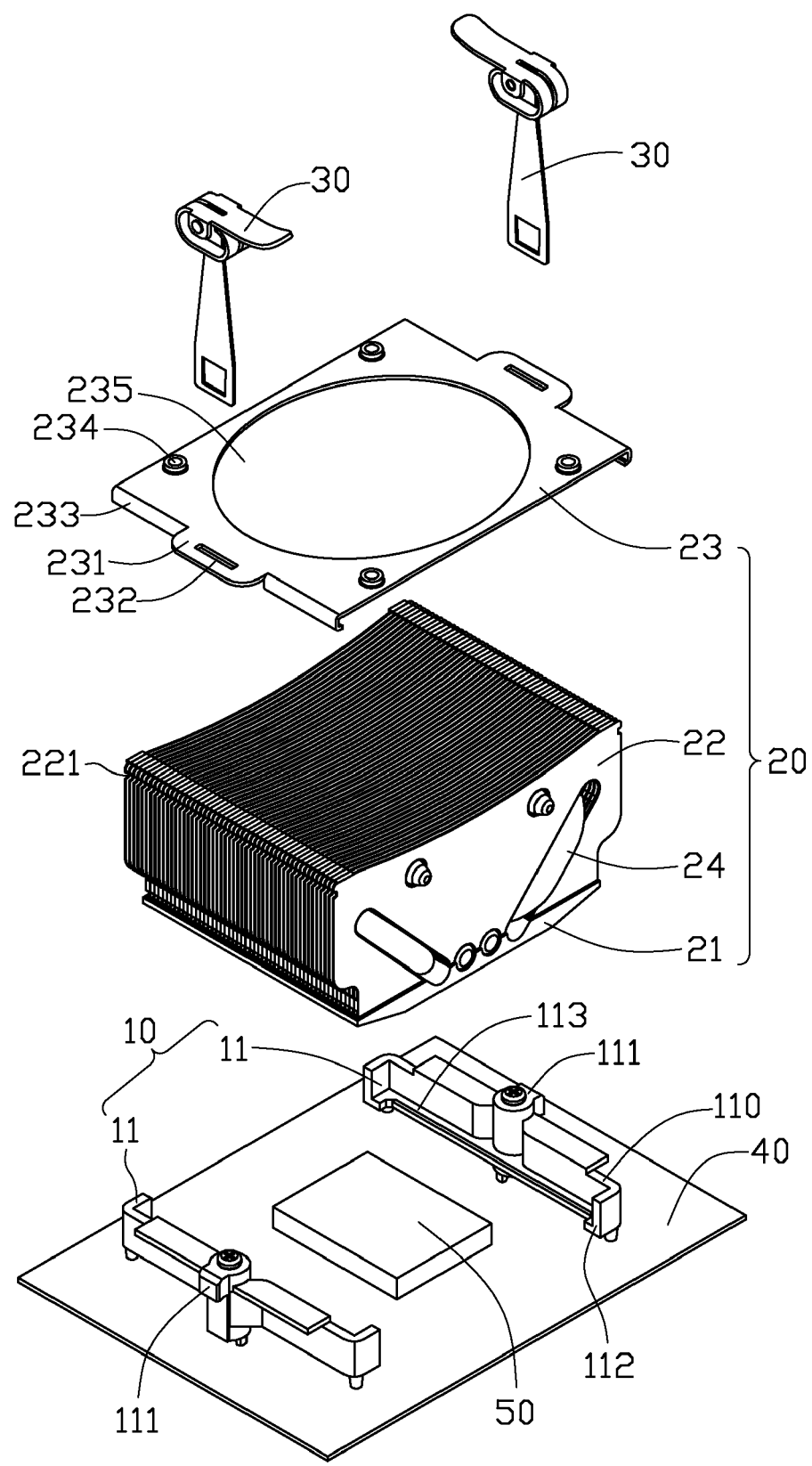
FIG. 1 is an exploded, isometric view of a printed circuit board with a heat generating electronic component disposed thereon and a heat dissipation apparatus in accordance with a preferred embodiment of the present invention.

Referring to FIG. 1, a heat dissipation apparatus according to a preferred embodiment of the present invention is shown. The heat dissipation apparatus includes a retention module 10, a heat sink 20 and a pair of fasteners 30. The retention module 10 is mounted to a printed circuit board 40 with a heat generating electronic component 50 disposed thereon. The heat sink 20 is mounted on and has an intimate contact with the heat generating electronic component 50. The fasteners 30 are arranged at two opposite sides of the heat sink 20 and engaged with the retention module 10 so as to maintain the intimate contact between the heat sink 20 and the heat generating electronic component 50.

The retention module 10 includes a pair of opposite retention bases 11. The retention bases 11 are fixed to the printed circuit board 40 via screws, rivets or any other appropriate manners. Each of the retention bases 11 has a substantially linear shaped main body 110, a protrusion 111 extending outwardly from a middle portion of the main body 110, and two blocking plates 112 extending inwardly from two opposite ends of the main body 110. A space 113 is enclosed by the retention bases 11, receiving a bottom of the heat sink 20 therein. Alternatively, the retention module 10 may be a rectangular frame with a rectangular space defined in a middle portion thereof for receiving the bottom of the heat sink 20 therein.

The heat sink 20 includes a base plate 21, a plurality of fins 22 extending upwardly from the base plate 21, four U-shaped heat pipes 24 extending through the fins 22, and a fastening cover 23 covering the fins 22. The base plate 21 has a bottom surface intimately contacting with the heat generating electronic component 50. Each of the heat pipes 24 has an end contacting with a top surface of the base plate 21 and an opposite end extending through the fins 22.

The fastening cover 23 is rectangular in profile and has two arms 231 extending outwardly from middle portions of two opposite sides thereof. Each of the arms 231 defines a slot 232 through top and bottom surfaces, extending along a longitudinal direction thereof. The fastening cover 23 further has four hooks 233 extending downwardly and then inwardly from sides of the arms 231. The fins 22 of the heat sink 20 define two receiving grooves 221 at top portions thereof, receiving the hooks 233 of the fastening cover 23 therein. The fastening cover 23 defines four mounting holes 234 at corners thereof, for mounting a heat dissipating fan (not shown) on the heat sink 20. The fastening cover 23 also defines a round opening 235 at a middle portion thereof so that airflow generated by the heat dissipating fan can flow therethrough towards the fins 22 of the heat sink 20.

Figure 2:
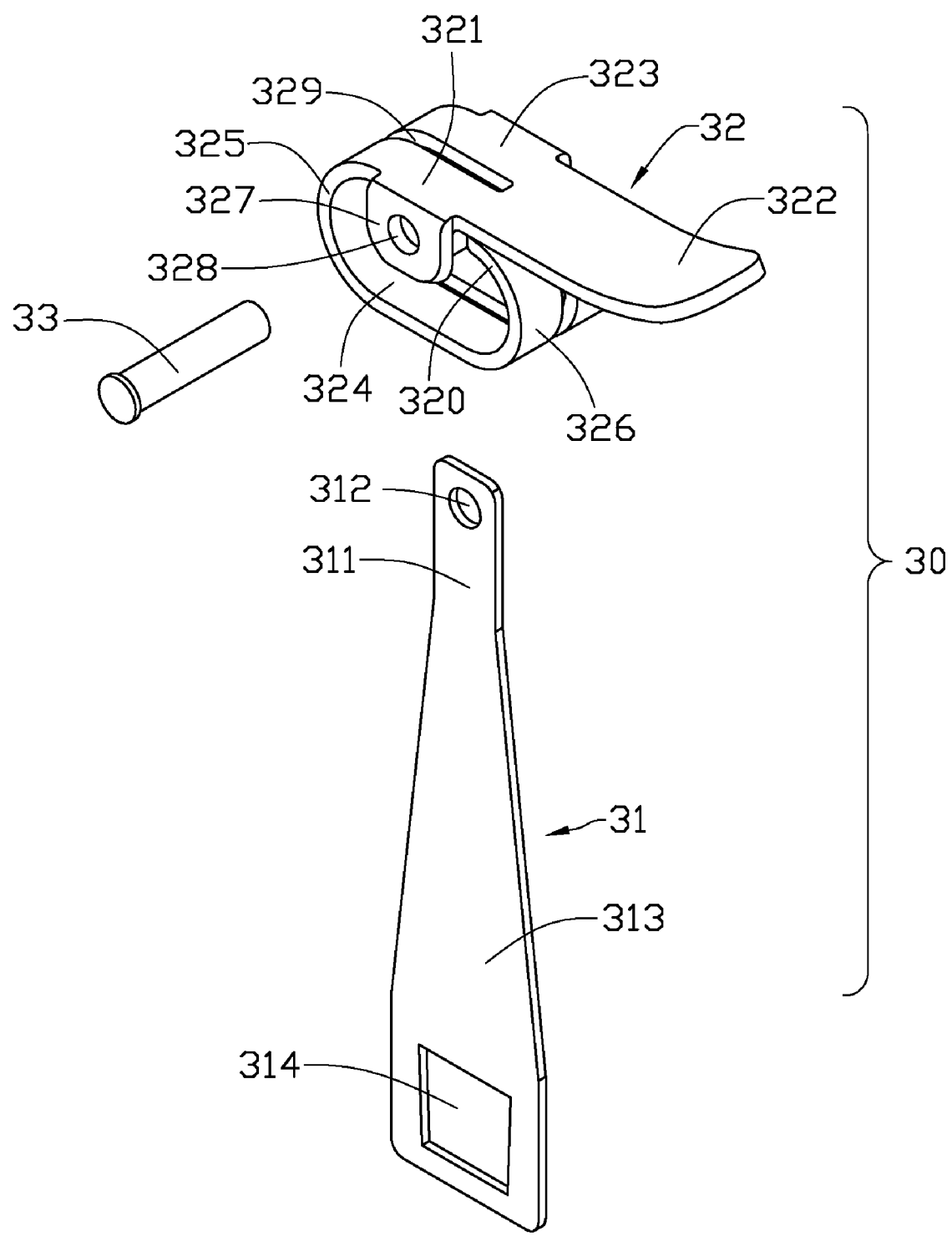
FIG. 2 is an exploded, isometric view of a fastener of the heat dissipation apparatus of FIG. 1.

Referring to FIG. 2, the fastener 30 includes a fastening member 31, an operating member 32 and a pivot member 33 such as a column pin for connecting the fastening member 31 with the operating member 32. The fastening member 31 is substantially linear shaped in profile and is punched from a strip-like metal plate. The fastening member 31 defines a round pivot hole 312 at a top 311 thereof, and a rectangular receiving hole 314 at a bottom 313 thereof. Alternatively, the fastening member 31 may have other configurations, such as an inverted T-shaped configuration having a plurality of receiving holes defined at a bottom thereof. Accordingly, the retention base 11 may have a plurality of protrusions 111 extending from the main body 110 thereof.

The operating member 32 is punched from a strip-like metal plate. The operating member 32 includes a pressing portion 321 and an operation portion 322 extending from an end of the pressing portion 321. The pressing portion 321 is curved to have a substantially ellipse configuration. A center of the ellipse is empty so that the pressing portion 321 can provide resilient force as it is being depressed. The pressing portion 321 includes a planar top section 323, a planar bottom section 324 opposite to the top section 323, a first C-shaped arc section 325 connecting opposite ends of the top section 323 and the bottom section 324, and a second C-shaped arc section 326 connecting with the other end of the bottom section 324 and contacting with the other end of the top section 323. The second arc section 326 has a free end 320 abutting against the other end of the top section 323 and can freely moving along the top section 323 as the pressing portion 321 is depressed. The top section 323 of the pressing portion 321 has two parallel ears 327 extending downwardly from two opposite sides thereof. Each of the ears 327 defines a round hole 328 therein. A distance between a centre of the round hole 328 and the top section 323 of the pressing portion 321 is smaller than that between the centre of the round hole 328 and the bottom section 324 of the pressing portion 321. That is, the round hole 328 is eccentrically arranged on the pressing portion 321. The pressing portion 321 defines a channel 329 extending through the top section 323, the first arc section 325, the bottom section 324 and the second arc section 326 thereof. The operation portion 322 extends from the other end of the top section 323 with a free end thereof slightly warped upwardly so as to benefit holding of the operation portion 322 of the operating member 32.

Figure 3:
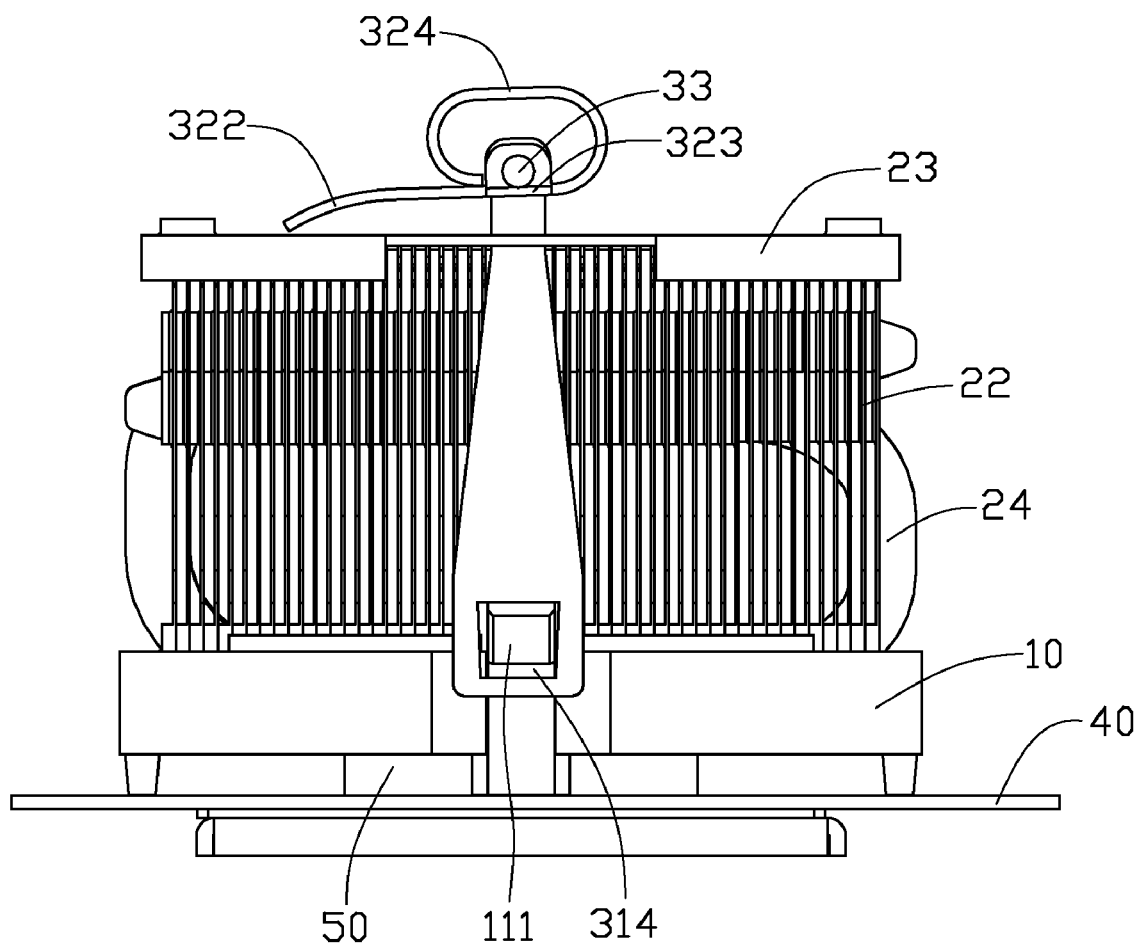
FIG. 3 is an assembling view of the heat dissipation apparatus and the printed circuit board at an unlocked position.
Figure 4:
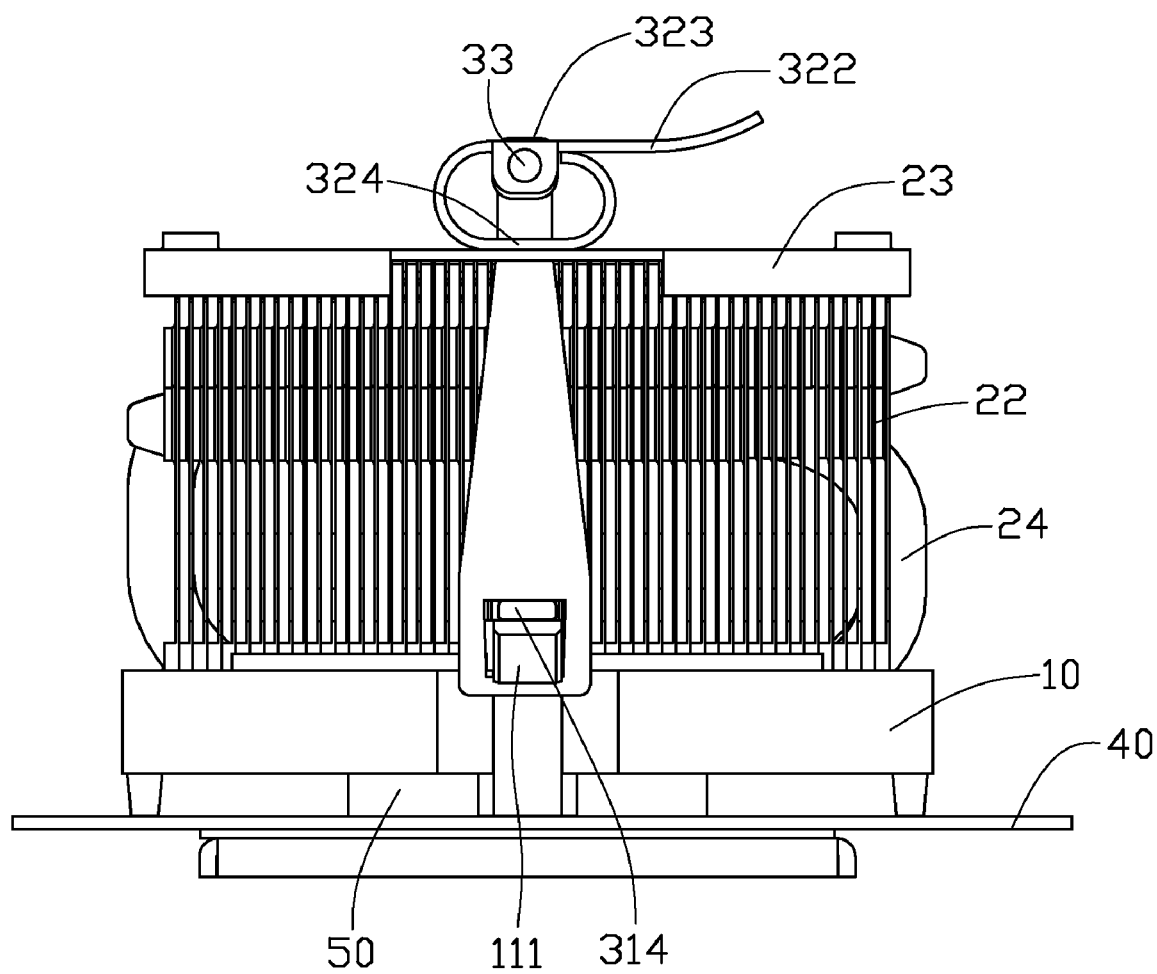
FIG. 4 is an assembled view of the heat dissipation apparatus and the printed circuit board at a locked position.
Figure 5:
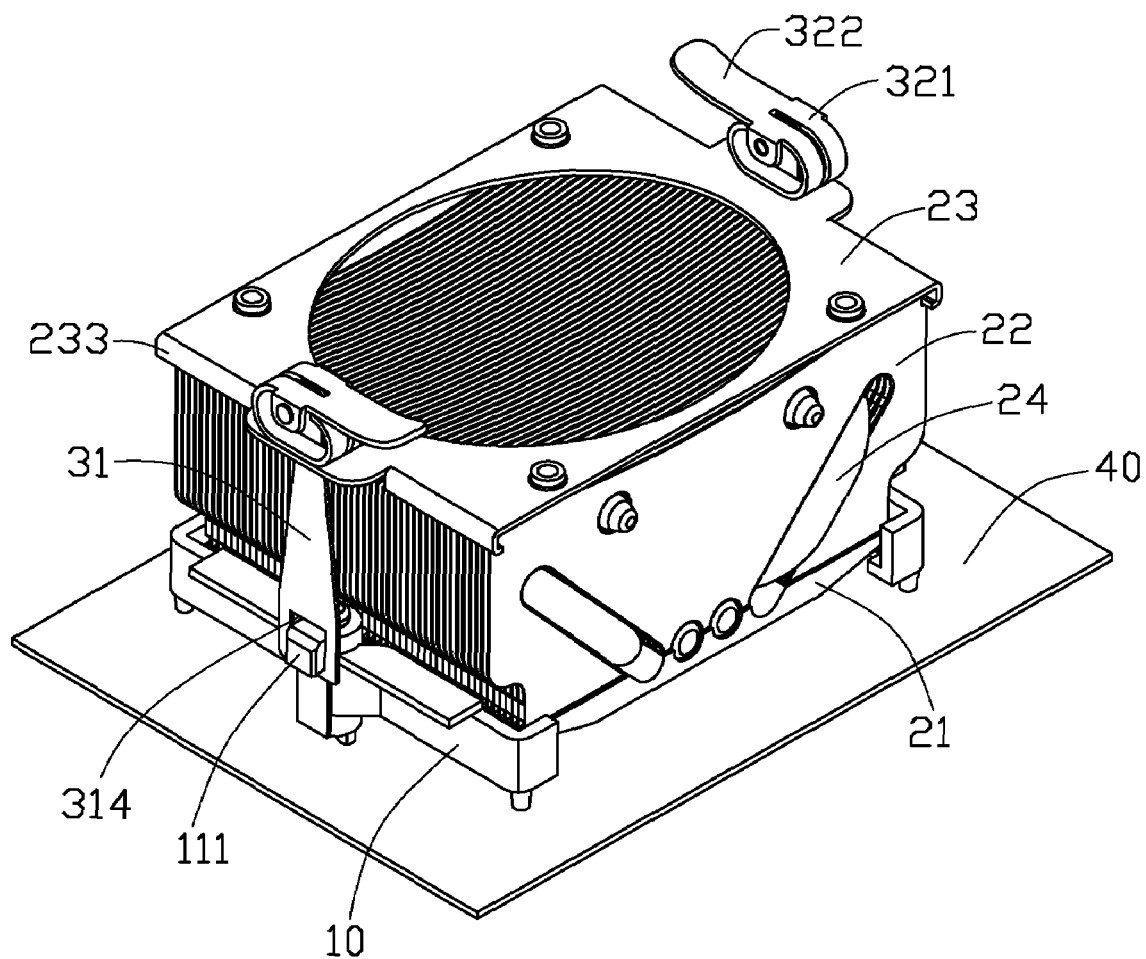
FIG. 5 is an assembled, isometric view of the heat dissipation apparatus and the printed circuit board at the locked position.

Referring to FIGS. 3 and 4, in assembly of the heat dissipation apparatus to the printed circuit board 40, the hooks 233 of the fastening cover 23 slide into and engage in the receiving grooves 221 of the heat sink 20 along longitudinal directions of the receiving grooves 221 so that the fastening cover 23 is mounted on the heat sink 20. The fastening members 31 of the fasteners 30 extend through the slots 232 of the fastening cover 23 with the pivot holes 312 located above top surfaces of the arms 231. The operating members 32 of the fasteners 30 are disposed on the arms 231 of the fastening cover 23, and the fastening members 31 are received in the channels 329 of the operating members 32 with the pivot holes 312 of the fastening members 31 aligning with the round holes 328 of the operating members 32. The pivot members 33 extend through the pivot holes 312 of the fastening members 31 and the round holes 328 of the operating members 32, joining the fastening members 31 and the operating members 32 together. The fasteners 30 are thus mounted on the heat sink 20. The heat sink 20 and the fasteners 30 are placed on the printed circuit board 40, with the base plate 21 of the heat sink 20 being received in the space 113 formed between the retention bases 11 and the protrusions 111 of the retention bases 11 being received in the receiving holes 314 of the fasteners 30. In this position, the top sections 323 of the operating members 32 of the fasteners 30 contact with top surfaces of the arms 231 of the fastening cover 23 and the heat dissipation apparatus is in an unlocked position. The operation portions 322 of the operating members 32 are driven to rotate along clockwise directions until the bottom sections 324 of the pressing portions 321 of the operating members 32 abuts against the top surfaces of the fastening cover 23 of the heat sink 20. Meanwhile, the fastening members 31 are driven to move upwardly due to the rotation of the operating members 32. Accordingly, the heat sink 20 is pressed downwardly to intimately contact with the heat generating electronic component 50. Therefore, the heat sink 20 is mounted to the heat generating electronic component 50 and the heat dissipation apparatus is locked.

In the present heat dissipation apparatus, the operating member 32 of the fastener 30 is curved to create an empty ellipsoid configuration from a strip-like metal plate. Therefore, the operating member 32 can provide resilient force when it is depressed. This makes the contact between the heat sink 20 and the heat generating electronic component 50 cannot become loose after undergoing longtime oscillating forces. The heat dissipation apparatus can thus be used longer time than the related heat dissipation apparatus.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation apparatus comprising:
   a retention module configured for being mounted on a printed circuit board with a heat generating electronic component disposed thereon;
   a heat sink disposed on the retention module;
   a fastening cover covering the heat sink; and
   a plurality of fasteners connecting with the retention module and the fastening cover, configured for mounting the heat sink onto the heat generating electronic component, each of the fasteners comprising:

a fastening member having a first end engaged with the retention module and a second end opposite to the first end; and an operating member comprising a resilient pressing portion pivotably connected with the second end of the fastening member and contacting with the fastening cover, and an operation portion connected with the pressing portion;

wherein the fastening cover defines a plurality of slots therein, the pressing portion defines a channel therethrough, the second end of the fastening member extending through the slots of the fastening cover and being received in the channel of the pressing portion and being pivotably connected with the pressing portion of the operating member.

2. The heat dissipation apparatus as described in claim 1, wherein the pressing portion is curved from a strip-like metal plate to have an empty ellipsoid configuration.

3. The heat dissipation apparatus as described in claim 1, wherein the pressing portion has two ears extending downwardly from a top section thereof, each of the ears defining a round hole therein, the fastening member defining a pivot hole at the second end thereof, a pivot member extending through the round holes of the operating member and the pivot hole of the fastening member to connect the operating member with the fastening member.

4. The heat dissipation apparatus as described in claim 3, wherein a distance between a centre of the round hole and the top section of the pressing portion is smaller than that between the centre of the round hole and a bottom section of the pressing portion.

5. The heat dissipation apparatus as described in claim 4, wherein the round hole is eccentrically arranged on the pressing portion.

6. The heat dissipation apparatus as described in claim 1, wherein the pressing portion of the operating member comprises a top section, a bottom section opposite to the top section, a first arc section connecting opposite ends of the top section and the bottom section, and a second arc section connecting with another end of the bottom section.

7. A heat dissipation apparatus comprising:

a heat sink; and a fastener configured for mounting the heat sink onto a printed circuit board with a heat generating electronic component disposed thereon, the fastener comprising:

a fastening member having a first end configured for connecting with a retention module mounted on the printed circuit board and a second end opposite to the first end; and an operating member comprising a curved pressing portion pivotably connected with the second end of the fastening member and an operation portion connected with the pressing portion, wherein the pressing portion provides a resilient fore as being depressed;

wherein the operating member is curved from a strip-like metal plate.

8. The heat dissipation apparatus as described in claim 7, wherein the pressing portion of the operating member has an empty ellipsoid configuration.

9. The heat dissipation apparatus as described in claim 7, wherein the pressing portion of the operating member comprises a top section, a bottom section opposite to the top section, a first arc section connecting opposite ends of the top section and the bottom section, and a second arc section connecting with another end of the bottom section.

10. The heat dissipation apparatus as described in claim 9, wherein the second arc section has an end abutting against another end of the top section.

11. The heat dissipation apparatus as described in claim 9, wherein the top section of the pressing portion of the operating member has two ears extending downwardly from two opposite sides thereof, each of the ears defining a round hole therein, the fastening member defining a pivot hole at the second end thereof, a pivot member extending through the round holes of the operating member and the pivot hole of the fastening member to connect the operating member with the fastening member.

12. The heat dissipation apparatus as described in claim 11, wherein a distance between a centre of the round hole and the top section of the pressing portion is smaller than that between the centre of the round hole and the bottom section of the pressing portion.

13. The heat dissipation apparatus as described in claim 12, wherein the round hole is eccentrically arranged on the pressing portion.

14. The heat dissipation apparatus as described in claim 9, wherein the pressing portion defines a channel extending through the top section, the first arc section, the bottom section and the second arc section thereof.

15. The heat dissipation apparatus as described in claim 9, wherein the operation portion extends from another end of the top section with a free end thereof warped upwardly.

* * * * *